(12) United States Patent
Kirihara et al.

(10) Patent No.: US 11,870,083 B2
(45) Date of Patent: Jan. 9, 2024

(54) EXTERIOR BODY, ABNORMALITY DETECTOR, AND ABNORMALITY DETECTION SYSTEM

(71) Applicant: NEC Corporation, Tokyo (JP)

(72) Inventors: Akihiro Kirihara, Tokyo (JP); Yuma Iwasaki, Tokyo (JP); Masahiko Ishida, Tokyo (JP); Koichi Terashima, Tokyo (JP); Ryohto Sawada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 298 days.

(21) Appl. No.: 17/286,619

(22) PCT Filed: Oct. 25, 2019

(86) PCT No.: PCT/JP2019/041844
§ 371 (c)(1),
(2) Date: Apr. 19, 2021

(87) PCT Pub. No.: WO2020/090638
PCT Pub. Date: May 7, 2020

(65) Prior Publication Data
US 2021/0366666 A1    Nov. 25, 2021

(30) Foreign Application Priority Data
Nov. 1, 2018  (JP) ................. 2018-206482

(51) Int. Cl.
*H01M 50/124* (2021.01)
*H01M 50/14* (2021.01)
*H01M 10/48* (2006.01)
*H01M 50/10* (2021.01)
(Continued)

(52) U.S. Cl.
CPC ......... *H01M 50/124* (2021.01); *H01M 10/48* (2013.01); *H01M 50/10* (2021.01);
(Continued)

(58) Field of Classification Search
CPC .. H01M 50/124; H01M 50/14; H01M 50/105; H01M 50/119; H01M 50/131; H01M 50/10; H01M 10/48; H10N 15/20
See application file for complete search history.

(56) References Cited

U.S. PATENT DOCUMENTS

2020/0194651 A1   6/2020 Iwasaki et al.

FOREIGN PATENT DOCUMENTS

CN         207068892 U  *  3/2018
JP         H08083630 A     3/1996
(Continued)

OTHER PUBLICATIONS

English machine translation of Cui et al. (CN 207068892 U) (Year: 2018).*

(Continued)

*Primary Examiner* — Sarah A. Slifka
(74) *Attorney, Agent, or Firm* — Sughrue Mion, PLLC

(57) ABSTRACT

Provided are an exterior body and an abnormality detector capable of suppressing bulking even when a heat generation detection function is provided. The exterior body of an electronic device generates heat during operation and is characterized by being provided with a magnetic body that is at least a portion of the exterior body, that has spontaneous magnetization, and that generates an electromotive force by exhibiting an abnormal Nernst effect through heat generation of the electronic device, wherein an electrode for extracting power is provided to the magnetic body.

10 Claims, 18 Drawing Sheets

(51) Int. Cl.
*H01M 50/105* (2021.01)
*H01M 50/119* (2021.01)
*H01M 50/131* (2021.01)
*H10N 15/20* (2023.01)

(52) U.S. Cl.
CPC ....... *H01M 50/105* (2021.01); *H01M 50/119* (2021.01); *H01M 50/131* (2021.01); *H01M 50/14* (2021.01); *H10N 15/20* (2023.02); H01M 2200/10 (2013.01)

(56) References Cited

FOREIGN PATENT DOCUMENTS

| | | | |
|---|---|---|---|
| JP | 2008292775 | A | 12/2008 |
| JP | 2010067502 | A | 3/2010 |
| JP | 2012092360 | A | 5/2012 |
| JP | 2012094374 | A | 5/2012 |
| JP | 2014072256 | A | 4/2014 |
| JP | 2016080394 | A | 5/2016 |
| JP | 2016161407 | A | 9/2016 |
| JP | 2017045578 | A | 3/2017 |
| WO | 2018105601 | A1 | 6/2018 |

OTHER PUBLICATIONS

International Search Report of PCT Application No. PCT/JP2019/041844 dated Dec. 24, 2019.
English translation of Written Opinion for PCT Application No. PCT/JP2019/041844 dated Dec. 24, 2019.

* cited by examiner

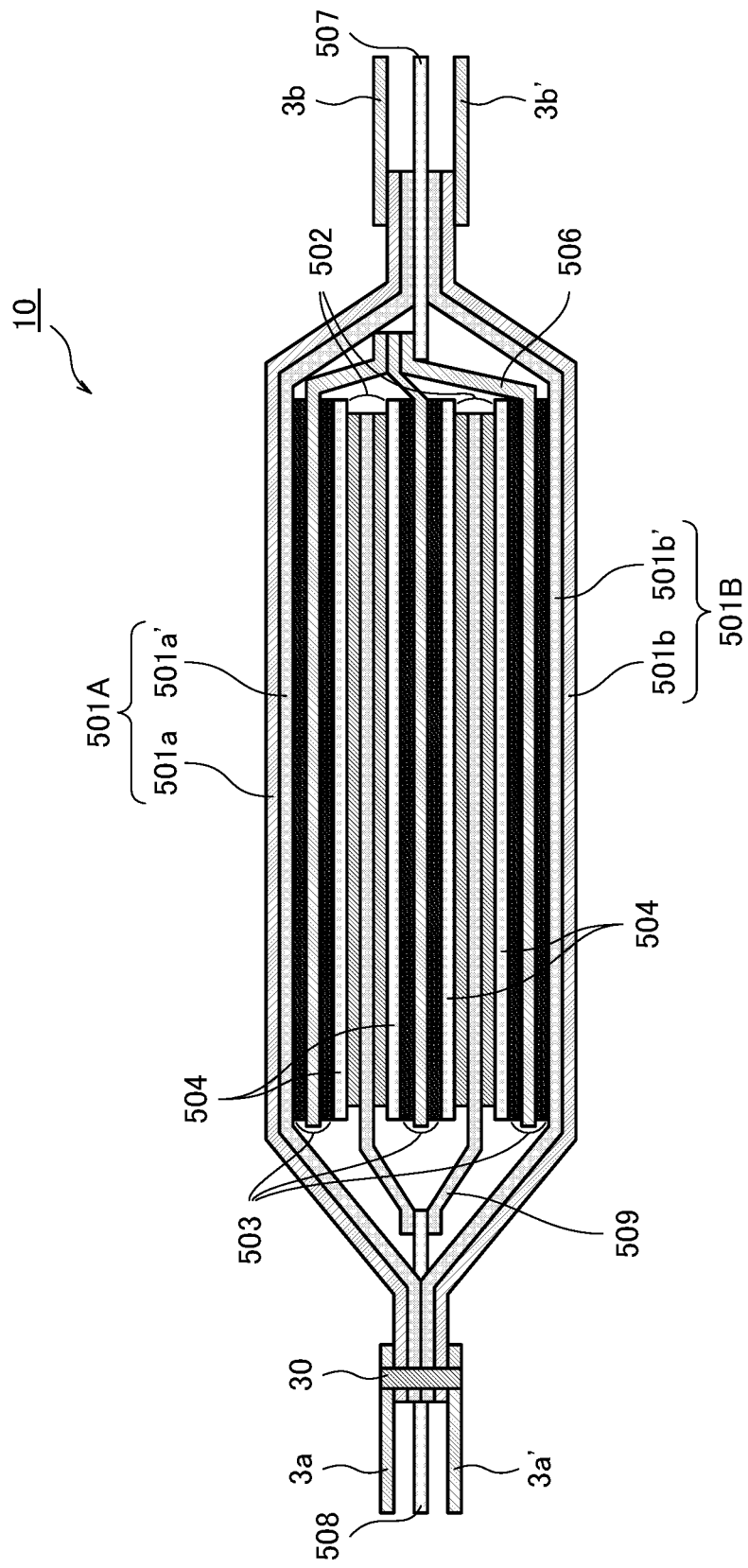

EXTERIOR BODY, ABNORMALITY DETECTOR, AND ABNORMALITY DETECTION SYSTEM

This application is a National Stage Entry of PCT/JP2019/041844 filed on Oct. 25, 2019, which claims priority from Japanese Patent Application 2018-206482 filed on Nov. 1, 2018, the contents of all of which are incorporated herein by reference, in their entirety.

TECHNICAL FIELD

The present invention relates to an exterior body for a battery, a capacitor, and the like, an abnormality detector, and an abnormality detection system.

BACKGROUND ART

In a power storage device such as a laminated lithium-ion battery and a capacitor, a structure where a battery element is sealed by an exterior body (laminate sheet) is generally known. The exterior body mainly includes metal foil and the like, and while in general, aluminum foil is used, an exterior body in which stainless steel plate having excellent strength is used as a base material is recently available (PTL 1). Also, in PTL 2, as a laminate case of a secondary battery, ferrite-based stainless steel foil is used.

In PTL 3, a thermoelectric element is provided by being in contact with a battery pack in a thermally conductive manner. At a time of abnormality of the battery pack, i.e., when an internal short circuit or the like of a battery occurs and a temperature of the battery abnormally increases, electromotive force is generated in the thermoelectric element by thermal energy based on the increase. It is described that a temperature monitor circuit is operated by using the electromotive force and a fact that abnormality in temperature occurs is stored in a storage means.

PTL 4 relates to an abnormality detection device that detects abnormality of a device including a rotation unit such as a pump. Electric power is generated by using a thermoelectric element that generates electric power through a temperature difference, specifically, a thermoelectric element using a Seebeck effect of a Peltier element, and a generated electric charge is stored in a capacitor. When charging is carried out up to a constant voltage, discharging is carried out by a resistance. While in a case of being normal a cycle time of charging/discharging is long, the cycle time becomes short when abnormal heat is generated. Thereby, abnormality is detected.

CITATION LIST

Patent Literature

[PTL 1] Japanese Unexamined Patent Application Publication No. 2012-094374
[PTL 2] Japanese Unexamined Patent Application Publication No. 2012-092360
[PTL 3] Japanese Unexamined Patent Application Publication No. H08-083630
[PTL 4] Japanese Unexamined Patent Application Publication No. 2016-161407

SUMMARY OF INVENTION

Technical Problem

In PTLs 3 and 4, a thermoelectric element is attached to a heat generation portion. However, this configuration produces a problem of being thick and bulky. In PTLs 3 and 4, a thermoelectric element and a measurement object (a battery pack and a device including a rotation unit) to be attached with the thermoelectric element are separate bodies, thereby resulting in a bulky body by the thermoelectric element and in difficulty in achieving a thin body. An exterior body formed of a stainless material being used in PTLs 1 and 2 is intended only for sealing/protection of a battery element, and an exterior body having a function of detecting a heating body has been unknown so far.

An object of the present invention is to provide an exterior body capable of suppressing bulking even when a heat generation detection function is included, an abnormality detector, and an abnormality detection system.

Solution to Problem

The present invention relates to an exterior body of an electronic device that generates heat during operation, the exterior body including: a magnetic body, as at least a part of the exterior body, that has spontaneous magnetization and generates electromotive force by exhibiting an abnormal Nernst effect through heat generation of the electronic device; and an electrode for extracting power, being provided on the magnetic body.

The present invention relates to an abnormality detector of a secondary battery, the abnormality detector including: a magnetic body film that has spontaneous magnetization and generates electromotive force by exhibiting an abnormal Nernst effect through heat generation of the secondary battery, being provided on a battery element constituting the secondary battery; and an electrode for extracting power, being provided on the magnetic body film.

Advantageous Effects of Invention

According to the exterior body, the abnormality detector, and the abnormality detection system of the present invention, bulking can be suppressed even when a heat generation detection function is included.

BRIEF DESCRIPTION OF DRAWINGS

FIG. 2A is a schematic cross-sectional diagram of the battery according to the first example embodiment of the present invention in which the schematic cross-sectional diagram illustrates an example where electrodes of an upper portion and a lower portion of one side are short-circuited.

FIG. 8 is a schematic cross-sectional diagram between A and B in

FIG. 7.

EXAMPLE EMBODIMENT

First Example Embodiment

Figure 1A:
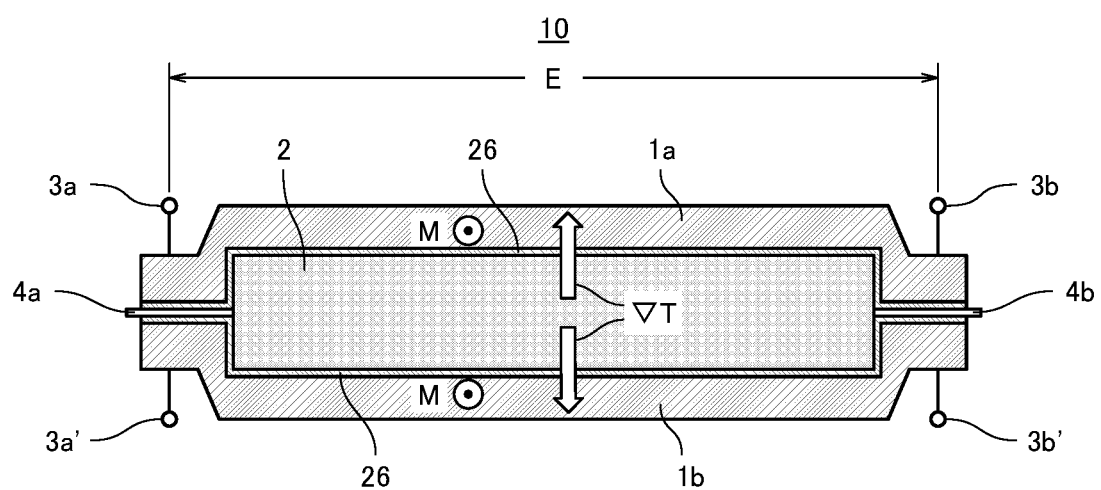
FIG. 1A is a schematic cross-sectional diagram of a battery according to a first example embodiment of the present invention.

By using FIG. 1A to FIG. 3, an exterior body according to a first example embodiment of the present invention is described. FIG. 1A is a schematic cross-sectional pattern diagram of a cell 10 including the exterior body according to the first example embodiment. For an exterior body, a magnetic body 1a and a magnetic body 1b that have spontaneous magnetization M in an in-plane direction as illustrated in the figure and generates electromotive force by exhibiting an abnormal Nernst effect through heat generation of a battery element are used. In an inside (battery element 2 side) of each of the magnetic bodies 1a and 1b, an insulation layer 26 formed of a resin or the like is provided. The magnetic bodies 1a and 1b each are formed of magnetic alloy foil having a thickness of several ten μm. In the exterior body, electrodes 3a, 3a', 3b, and 3b' for extracting electromotive force are provided. In FIG. 1A, the direction of the spontaneous magnetization M is a direction going from a back side to a front side of a paper surface. When the magnetic bodies 1a and 1b are not discriminated, a magnetic body 1 is referred to.

Figure 1B:
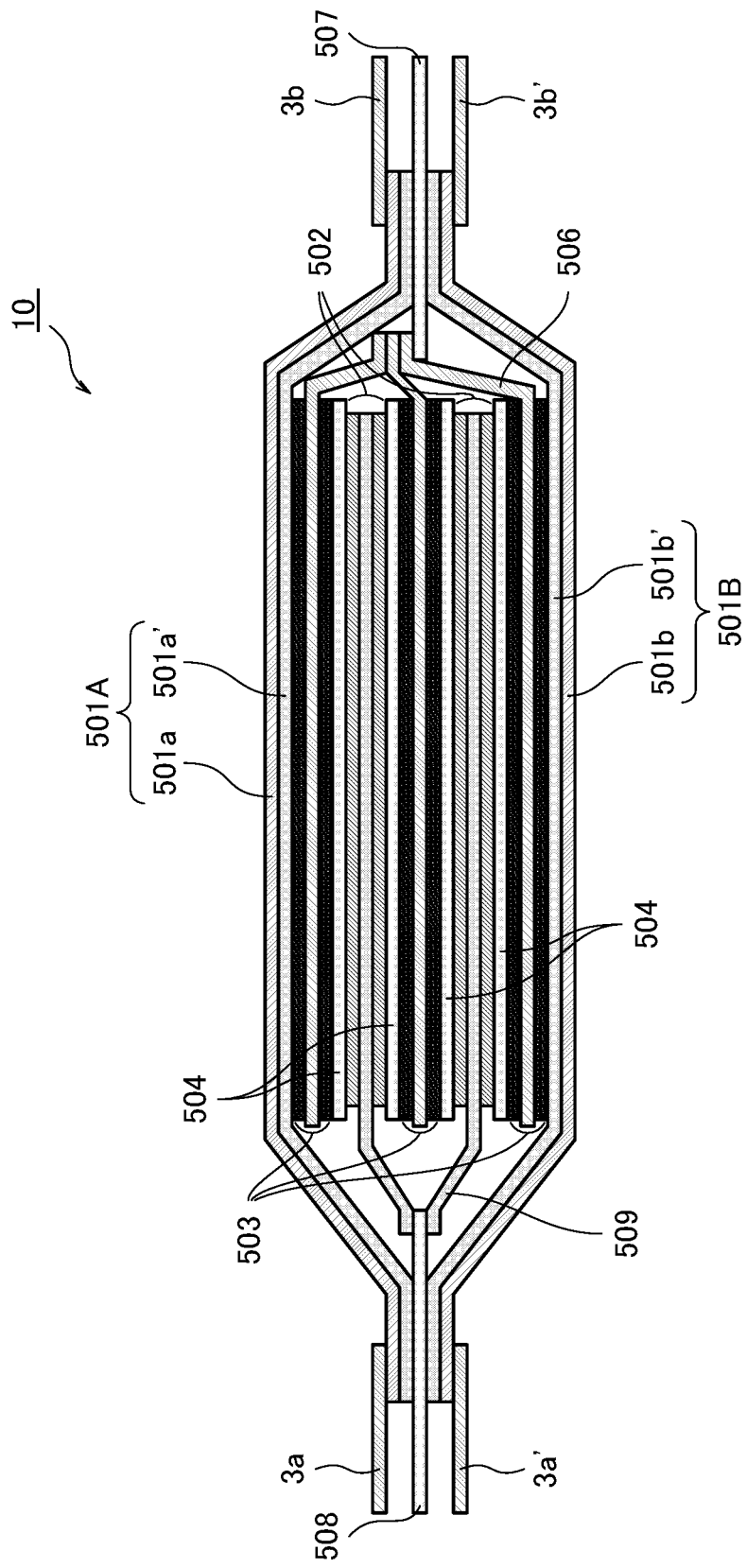
FIG. 1B is a schematic cross-sectional diagram of the battery according to the first example embodiment of the present invention.
Figure 1C:
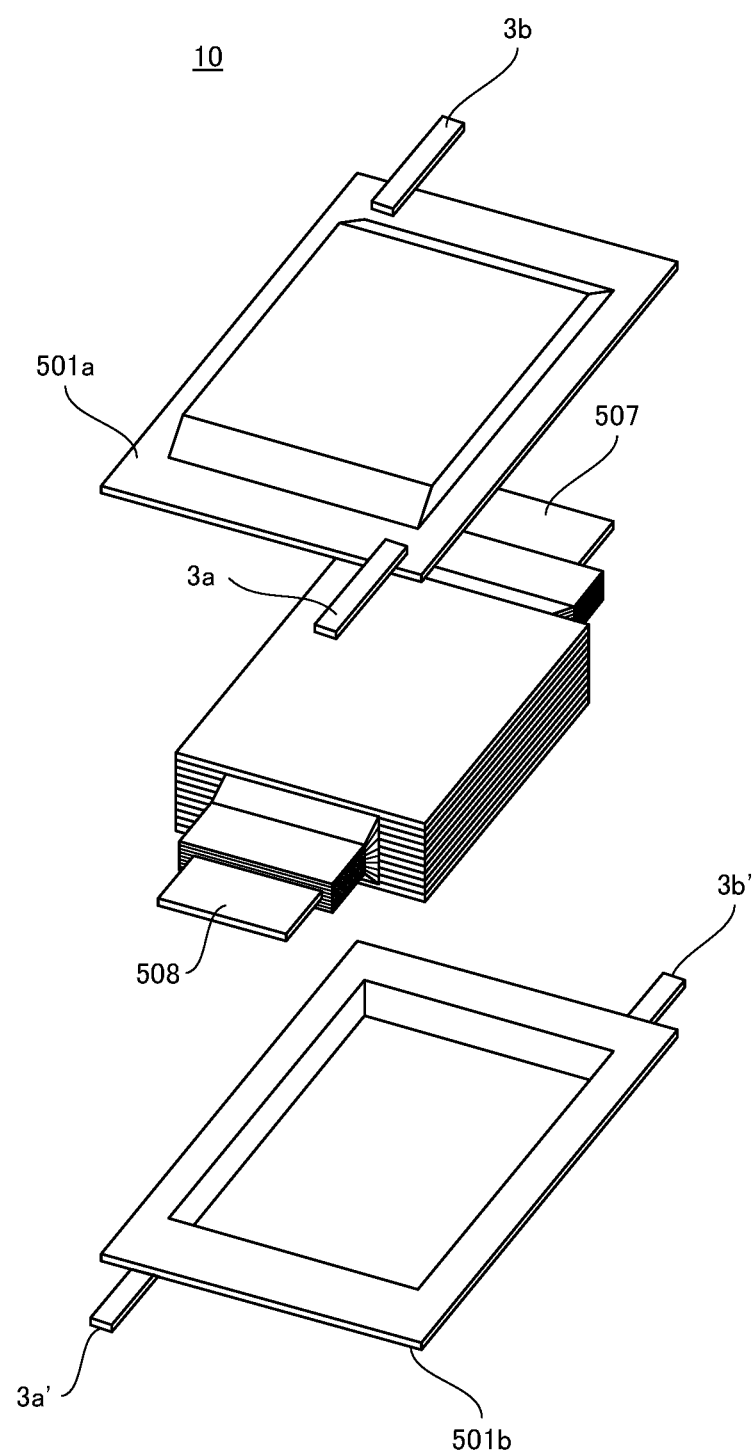
FIG. 1C is an exploded perspective view of the battery according to the first example embodiment of the present invention.
Figure 1D:
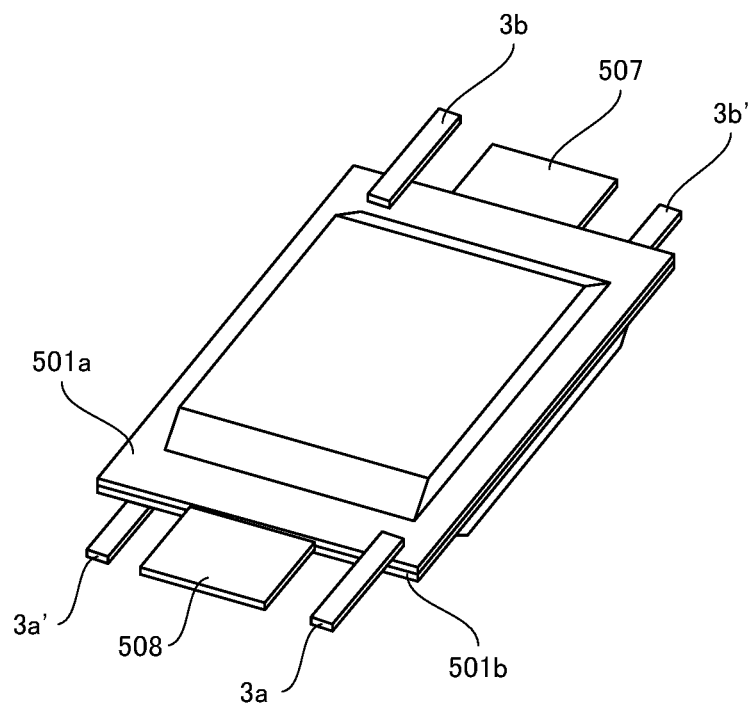
FIG. 1D is a perspective view illustrating the battery according to the first example embodiment of the present invention.

The cell 10 is, for example, a laminated lithium-ion secondary battery, and as illustrated in a cross-section of FIG. 1B, a positive electrode 502 and a negative electrode 503 are laminated via a separator 504 and are laminated, together with an electrolytic solution (not illustrated), by exterior bodies 501A and 501B in which a magnetic body and an insulator layer are laminated. The upper-side exterior body 501A has a bilayer structure where an outside is a magnetic body 501a and an inside is an insulator layer 501a', and similarly, the lower-side exterior body 501B has a bilayer structure where an outside is a magnetic body 501b and an inside is an insulator layer 501b'. In FIG. 1B, on a negative electrode side, a negative electrode lead unit 506 and a negative-electrode charging/discharging electrode 507 are provided, and on a positive electrode side, a positive electrode lead unit 509 and a positive-electrode charging/discharging electrode 508 are provided. FIG. 1C is a perspective view illustrating a state before a produced battery element 2 is sandwiched by an upper-side exterior body 501A and a lower-side exterior body 501B. FIG. 1B is a cross-sectional diagram formed by cutting FIG. 1D to be described later along a line connecting positive and negative charging/discharging electrodes 507 and 508. While not existing on a line connecting positive and negative charging/discharging electrodes, electrodes 3a, 3a', 3b, and 3b' are illustrated for easy understanding. An electrolytic solution is injected from an opening (not illustrated) that is sandwiched by magnetic bodies 501a and 501b and partially remains open, and thereafter the opening is sealed. FIG. 1D is a perspective view of a cell 10 produced in this manner. While FIG. 1C illustrates a form where a concave portion (convex portion) for accommodating a battery element in an exterior body is previously formed, formation may be carried out, by using a sheet-like exterior body, in such a way as to conform to a shape of a battery element when gas is removed after electrolytic solution injection. While a concave portion is formed in upper and lower exterior bodies, the concave portion may be formed in only one exterior body. Magnetic alloy foil has spontaneous magnetization M in a fixed direction in-plane of the foil. In FIG. 1A, both the magnetic bodies 1a and 1b being upper and lower exterior bodies of the battery element 2 have spontaneous magnetization M in a direction that is vertical to a paper surface and goes from a back side to a front side of the paper surface. In the battery element 2, heat is generated by storing/releasing actions of lithium during charging/discharging. Abnormal heat is generated by a cause such as an internal short-circuit, and an overload due to damage from an outside. When abnormal heat is generated in the battery element 2, a temperature gradient ∇T (heat flow) is generated in a thickness direction of the magnetic body 1. Normally, a battery element 2 side of the magnetic body 1 has high temperature, and an outside has low temperature. As a result, magnetic alloy foil exhibits an abnormal Nernst effect and electromotive force E is generated between the electrode 3a (3a') and the electrode 3b (3b') provided at both ends of the magnetic body 1. An abnormal Nernst effect is a phenomenon in which in a magnetic body subjected to magnetization (M) in a certain direction, when a heat flow ∇T is added, electromotive force E is generated in a direction (cross-product direction) orthogonal to both M and the ∇T. Thereby, between the electrodes 3a and 3b and between the electrode 3a' and the electrode 3b', an output (voltage) according to electromotive force E can be extracted.

In the case of FIG. 1A, in the magnetic body 1a, electromotive force E is generated from the left side of FIG. 1A to the right side (in a direction going from the electrode 3a to the electrode 3b). In contrast, in the magnetic body 1b, a direction of a temperature gradient ∇T is opposite to an upper side, and therefore electromotive force E is generated from the right side of FIG. 1A to the left side (in a direction going from the electrode 3b' to the electrode 3a'). The electrodes 3a and 3b each are provided at an end of the magnetic bodies 1a and 1b, and therefore, input may be made to a detection circuit (not illustrated) by causing the electrodes 3a and 3b on an upper side and the electrodes 3a' and 3b' on a lower side to have polarities opposite to each other. In other words, the electrodes 3a and 3b' are connected and the resulting connection is connected to one input terminal of the detection circuit, and the electrodes 3b and 3a' are connected and the resulting connection is connected to the other input terminal of the detection circuit. It is easy to mount the electrodes 3a, 3b, 3a', and 3b' when being disposed at a position where the electrodes are not overlapped with the charging/discharging electrodes 507 and 508 of the battery element 2.

Figure 1E:
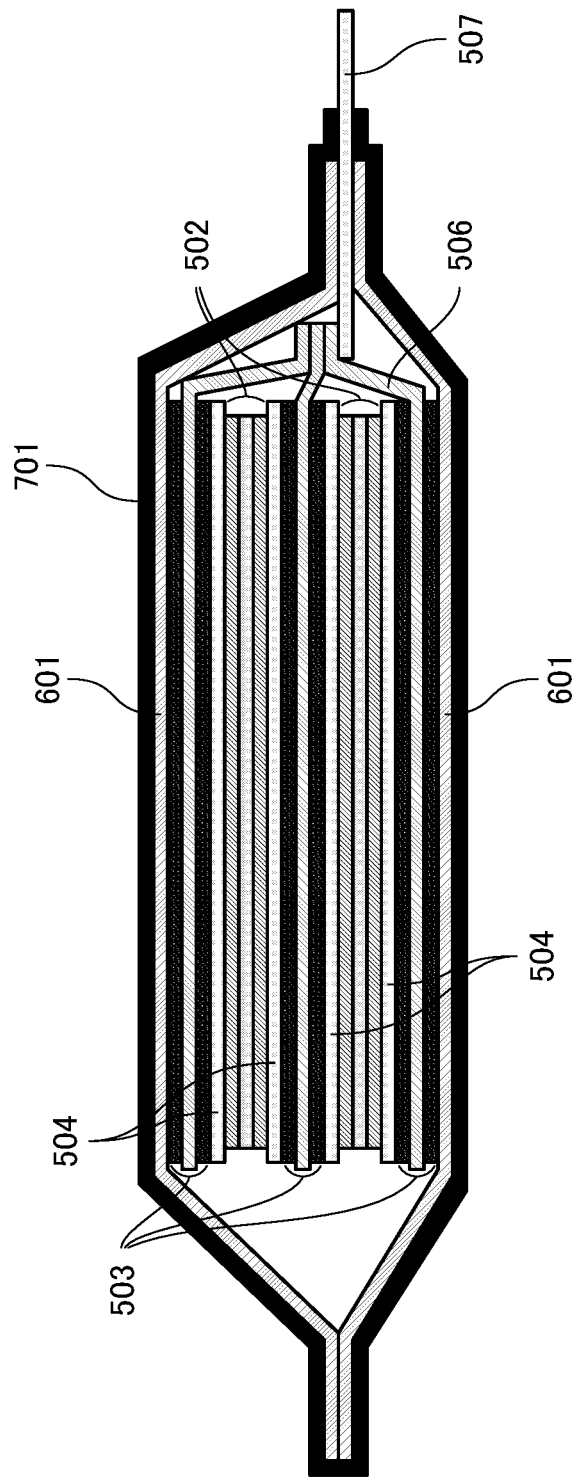
FIG. 1E is a schematic cross-sectional diagram of the battery according to the first example embodiment of the present invention.

In the cell 10 in FIGS. 1A to 1D, an exterior body itself is constituted by using a magnetic body. However, as in FIG. 1E, the cell 10 may have a structure where a magnetic body 701 such as magnetic alloy foil is laminated directly or via an insulation layer on an outer periphery of a laminated lithium-ion secondary battery covered with laminate film 601 that is not a magnetic body such as aluminum alloy. FIG. 1E illustrates a case where lamination is directly carried out. When being provided on an outer periphery of a laminated lithium-ion secondary battery, the magnetic body 701 may not necessarily be provided on the entire surface or the entire periphery of a laminate as in FIG. 1E and may be provided on a part of a laminate surface or one surface of the laminated lithium-ion secondary battery, which may be appropriately modified according to a purpose and usage. In FIG. 1E, an electrode for extracting electromotive force is not illustrated. While in FIG. 1E, a resin layer that coats a surface of the laminate film 601 is not illustrated, laminate film on a surface of which a resin layer is formed is used.

A detection circuit that detects voltage is provided in a battery management system (BMS) being a circuit that controls the cell 10. The detection circuit may be provided on a battery side. The detection circuit is a circuit that sets, as a threshold voltage, a voltage value relevant to a temperature, for example, a temperature which makes it possible to determine abnormal heat generation if a temperature becomes higher than such temperature, and determines abnormality when the threshold voltage is reached or exceeded. The battery element 2 generates heat even during normal operation based on storing/releasing actions of lithium during charging/discharging as described above, and therefore a temperature gradient ∇T is generated even during normal operation and voltage is also generated. Therefore, during normal operation, the exterior body according to the present example embodiment functions as a heat generation detector. However, when the temperature of the battery element 2 becomes abnormally high by occurrence of an internal short-circuit, being damaged from an outside, an overload, and the like, a generated voltage increases. It may be possible that voltages during normal operation are previously measured, an average value or a maximum value thereof is set as a threshold, and abnormal heat generation is determined when the threshold is reached or exceeded. A predetermined value other than an average value or a maximum value may be set as a threshold. It may be possible to set an average value as a first threshold and a maximum value as a second threshold and set a two-stage alarm in such a way that when the first threshold is reached, a detection circuit or a BMS issues a signal of "attention" to an outside, and when the second threshold is reached, the detection circuit or the BMS issues a signal of "warning". Due to temporal deterioration, an output of a battery gradually decreases, and therefore a normal value and an abnormal value of heat generation change and a first threshold and a second threshold based on these values also change. It may be possible that a detection circuit or BMS always or periodically performs monitoring and first and second thresholds are modified according to a battery output.

A battery may instantaneously have high temperature due to noise and the like, and as a result, electromotive force may increase at the instant. When the influence is intended to be eliminated, a detection circuit may be set in such a way that when a threshold is exceeded a plurality of times or a threshold is exceeded continuously over a predetermined time, abnormality is determined for a first time. As a threshold, not only voltage but also power, current, and the like are usable.

The exterior body according to the present example embodiment not only is an exterior body that protects the battery element 2 but also operates as a heat flow sensor. When abnormal heat generation occurs in a battery element, a heat flow flows from the battery element to an exterior body and an output voltage between electrodes rapidly increases due to abnormal Nernst thermal electromotive force resulting from the heat flow. Thereby, abnormality of the battery element can be detected early. In PTLs 3 and 4 described in the column of [Background Art], a thermoelectric element that detects abnormality and a measurement object (a battery pack and a device including a rotation unit) attached with the thermoelectric element are separate bodies, resulting in a bulky body by the thermoelectric element and in difficulty in achieving a thin body. However, the exterior body according to the present example embodiment has both a function of sealing/protecting a battery element and an abnormality detection function of a thermoelectric element and therefore is not bulky and can be thinned.

As magnetic alloy used for an exterior body, a stainless material that is, for example, iron-based alloy is usable. In general, stainless steel is roughly classified into five systems (an austenitic system, a ferritic-austenitic system, a ferritic system, a martensitic system, and a precipitation hardening system) in a classification based on metallographic structure, and among these, the systems other than the austenitic system are ferromagnetic and can be used as an exterior body according to the present example embodiment.

When power sufficient for driving a detection circuit is acquired by electromotive force generated through heat generation, the detection circuit can be driven without an external power supply.

In a battery in FIG. 1A to FIG. 1E, magnetic alloy is used for both exterior bodies on upper and lower sides of the battery element 2, but only either of the exterior bodies is applicable as a minimum. In this case, electromotive force is reduced to half.

Figure 2B:
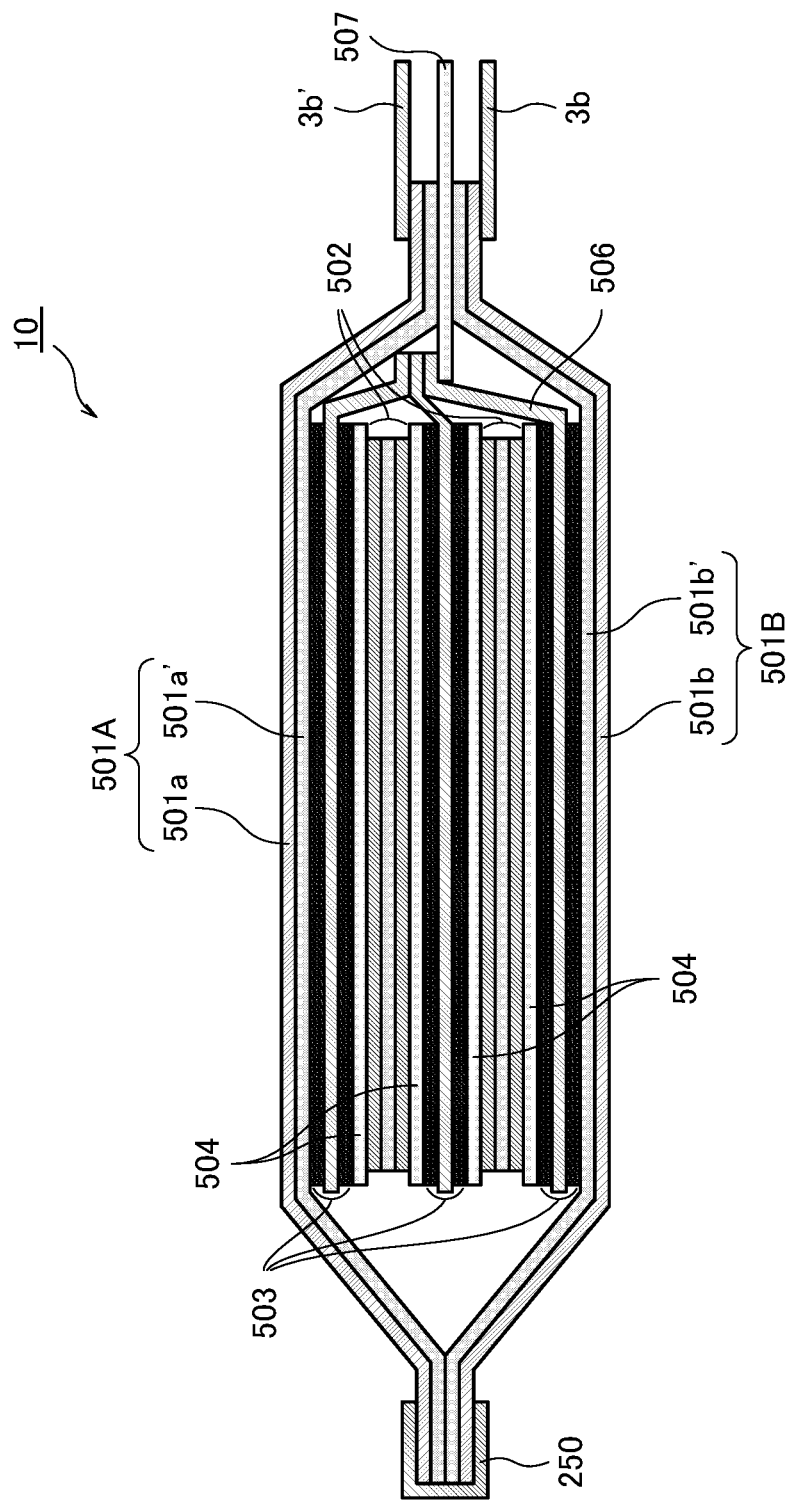
FIG. 2B is a schematic cross-sectional diagram of the battery according to the first example embodiment of the present invention in which the schematic cross-sectional diagram illustrates an example where electrodes of an upper portion and a lower portion of one side are short-circuited.
Figure 2C:
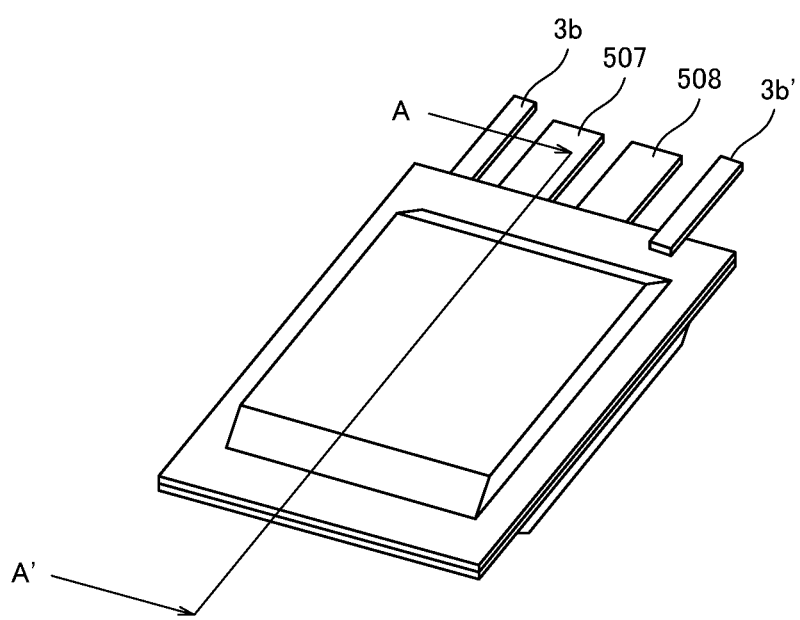
FIG. 2C is a perspective view of a cell in FIG. 2B.

As illustrated in FIG. 2A, when the electrode 3a and the electrode 3a' of one side are short-circuited, a voltage generated between the electrode 3b and the electrode 3b' of the opposite side doubles and detection sensitivity increases. FIG. 2A is a cross-sectional diagram in which FIG. 1D is cut along a line connecting positive and negative charging/discharging electrodes 507 and 508. While not existing on a line connecting positive and negative charging/discharging electrodes 507 and 508, electrodes 3a, 3a', 3b, and 3b' are illustrated for easy understanding. In order to make a short-circuit, as illustrated in the left side of FIG. 2A, a hole 30 is opened in the upper and lower exterior bodies 501A and 501B at a location not existing in the charging/discharging electrode 508 and the hole is filled with metal. The electrodes 3a and 3a' themselves may fill the hole 30. FIG. 2A illustrates a type in which a positive (or negative) charging/discharging electrode 508 is protruded on one side of a cell and a negative (or positive) charging/discharging electrode 507 is protruded on the opposite side. FIG. 2B is different from FIG. 2A and illustrates a type in which both positive and negative charging/discharging electrodes 507 and 508 are protruded on one side of a cell. In this example, ends of upper and lower exterior bodies 501A and 501B are sandwiched and caulked by using a metal piece 250 and are short-circuited. The exterior bodies 501A and 501B may be short-circuited by having the insulator layers 501a' and 501b' notched at an end thereof. As illustrated in FIG. 2A, a short-circuit may be achieved by opening a hole. FIG. 2C is a perspective view of the cell in FIG. 2B. FIG. 2B illustrates an A-A' cross-section of FIG. 2C. While not existing on the A-A' cross-section, electrodes 3b and 3b' are illustrated for easy understanding.

Figure 3:
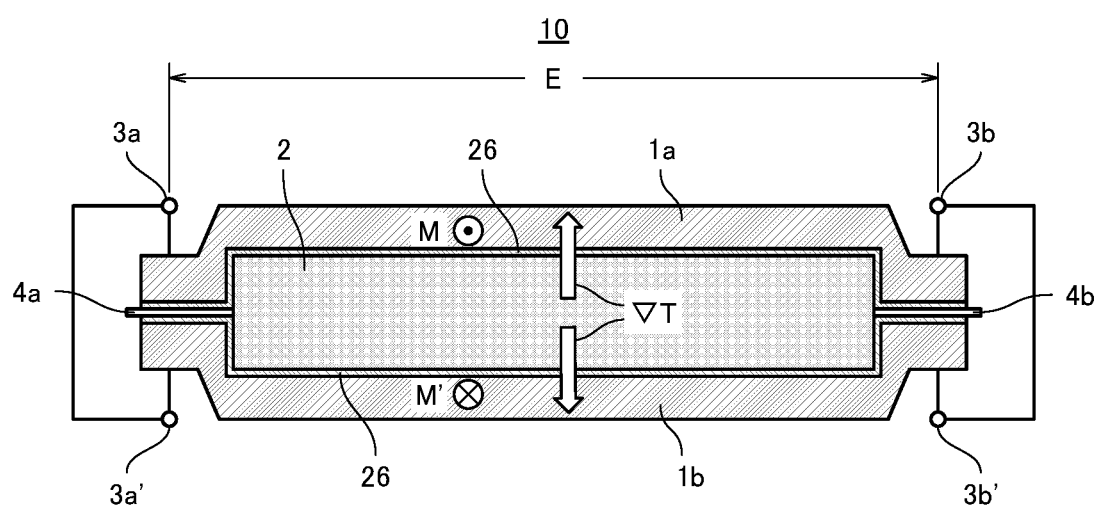
FIG. 3 is a schematic cross-sectional diagram of the battery according to the first example embodiment of the present invention in which the schematic cross-sectional diagram illustrates an example where electrodes of an upper portion and a lower portion on both sides are short-circuited.

When as illustrated in FIG. 3, in a magnetic body 1a of an upper side and a magnetic body 1b of a lower side, magnetization directions M and M' are caused to be opposite to each other as illustrated, directions of electromotive force E are the same on the upper side and the lower side. It is also possible to short-circuit both an electrode 3a on the upper side and an electrode 3a' on the lower side of one side and both an electrode 3b on the upper side and an electrode 3b' on the lower side of the opposite side and thereby extract electromotive force E similarly to FIG. 1. In order to make a short-circuit, for example, by using a metal piece, the upper electrode 3a and the lower electrode 3a' and the upper electrode 3b and the lower electrode 3b' may be connected.

Second Example Embodiment

According to the example embodiment in FIG. 1A to FIG. 1E, a magnetic body 1 was entirely constituted by using magnetic alloy that exhibits an abnormal Nernst effect. However, when a heat flow sensor is used, even a thickness of several ten μm is sufficient for magnetic alloy. A form where, as a part (sensing layer) constituting an exterior body, magnetic alloy is used is applicable. Specifically, as illustrated in a cross-sectional shape of FIG. 4A and FIG. 4B, a structure is made in which a magnetic alloy film 20 of a thickness of several μm is bonded, by sandwiching a resin layer 22, to non-magnetic alloy foil of a thickness of several ten μm covering a battery element 25 and an exterior body 24 where non-magnetic metal foil such as aluminum foil and a resin layer are laminated. The magnetic alloy film 20 has spontaneous magnetization in an in-plane direction, similarly to the example embodiment in FIG. 1A to FIG. 1E.

Figure 4A:
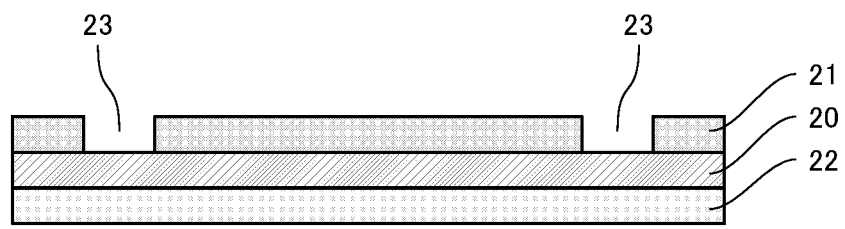
FIG. 4A is a schematic cross-sectional diagram of a battery according to a second example embodiment of the present invention.
Figure 4B:
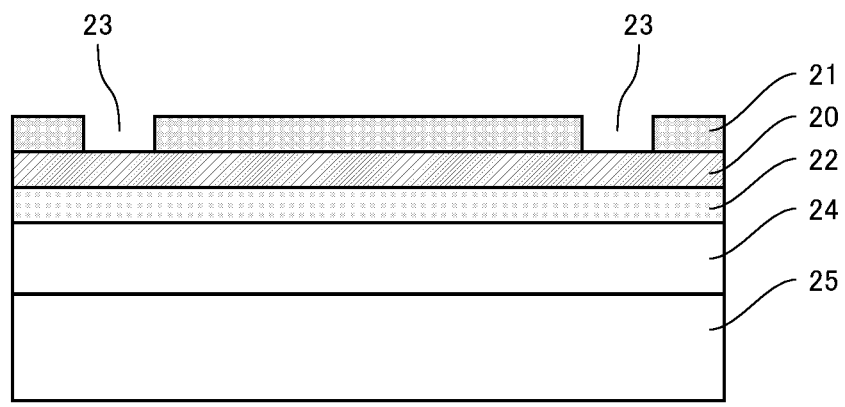
FIG. 4B is a schematic cross-sectional diagram of the battery according to the second example embodiment of the present invention.

Hereinafter, a bonding method is described. FIG. 4A is a cross-section for only the magnetic alloy film 20 excluding the battery element 25 and the exterior body 24. On both surfaces of magnetic alloy, resin layers 21 and 22 are formed. In a resin layer where an electrode is formed, an opening 23 is provided. The magnetic alloy film 20 is caused to adhere to the exterior body 24 by using an adhesive or the like (FIG. 4B). Metal foil for an exterior body may be made of aluminum or aluminum alloy. In FIG. 4B, magnetic alloy foil is caused to adhere to only one surface but may be caused to adhere to both surfaces.

A method in which, as in FIG. 4A and FIG. 4B, the magnetic alloy film 20 is caused to adhere to the exterior body 24 via the resin layer 22 after a battery is accommodated in the exterior body is simple. However, the magnetic alloy film 20 may be sandwiched between the battery element 25 and the exterior body 24 or may be embedded in the exterior body 24. When the magnetic alloy film 20 is sandwiched between the battery element 25 and the exterior body 24, it may be possible that a surface where the magnetic alloy film is in contact with an electrolytic solution is covered with a protection layer that is not eroded by the electrolytic solution, an electrode is provided on a side opposite to a side where the electrolytic solution exists, the exterior body 24 located on the electrode is opened, and via the opening, a signal is extracted from the electrode to an outside.

Third Example Embodiment

The magnetic alloy film according to the second example embodiment is entirely solid foil. However, according to the present example embodiment, a planar shape of a magnetic alloy film is not entirely solid but is formed into a winding shape such as a meandering pattern or a spiral pattern, and thereby electromotive force is increased.

Figure 5A:
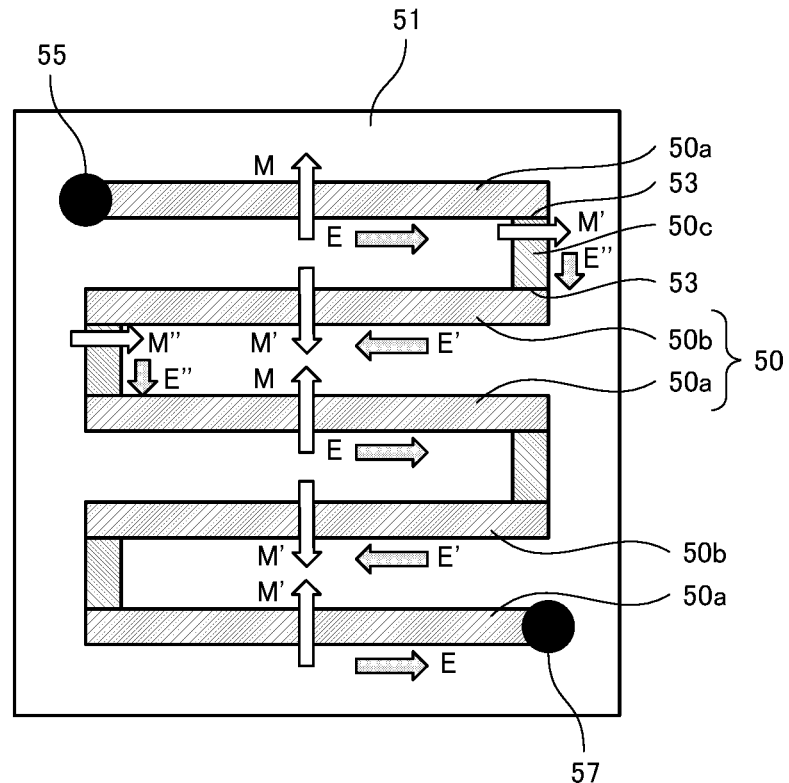
FIG. 5A is a diagram illustrating a planar shape of a magnetic alloy film according to a third example embodiment of the present invention.
Figure 5B:
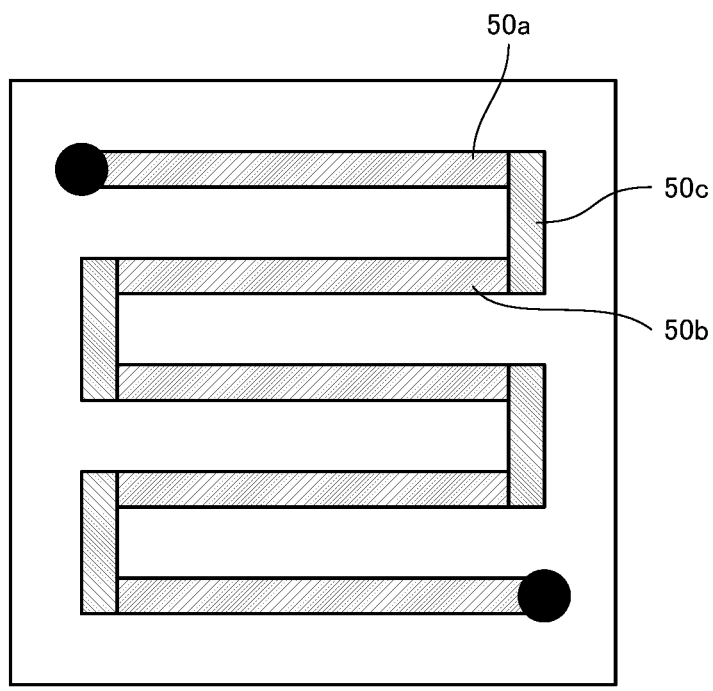
FIG. 5B is a diagram illustrating a planar shape of the magnetic alloy film according to the third example embodiment of the present invention.

FIG. 5A and FIG. 5B each is a plan view of a battery in which a planar shape of a magnetic alloy film between an electrode 55 and an electrode 57 is formed into a meandering shape. In FIG. 5A and FIG. 5B, only a magnetic alloy film 50 and a non-magnetic exterior body 51 to which the film is caused to adhere are illustrated and illustration of a resin layer provided on upper and lower sides of a battery element and the magnetic alloy film located in a portion covered with the exterior body 51 is omitted. A thickness of the magnetic alloy film 50 is several μm and a line width thereof is several ten μm to several mm. A direction of spontaneous magnetization M and M' is a direction of a line width in-plane of the magnetic alloy film 50, and a direction of spontaneous magnetization M of a certain magnetic alloy film 50a and a direction of spontaneous magnetization M' of a magnetic alloy film 50b adjacent to the former film are reversed in order not to cancel acquired electromotive force. When directions of spontaneous magnetization M and M' are set as reverse directions, electromotive force E generated by the spontaneous magnetization M and electromotive force E' generated by the spontaneous magnetization M' are added. A film 50c connecting the magnetic alloy films 50a and 50b is also caused to be the same magnetic alloy film and spontaneous magnetization M" is provided in an in-plane direction and also in a line-width direction illustrated in FIG. 5A and FIG. 5B in such a way that generated electromotive force is added. When a length of the film 50c is short, a non-magnetic alloy film is applicable. While a solid line for a border among 50a, 50b, and 50c is a borderline 53, in FIG. 5A, a borderline is set in such a way as to elongate 50a and 50b. However, as in FIG. 5B, a borderline may be set in such a way as to shorten 50a and 50b. While not illustrated, it may be possible that a borderline is set in a border between 50a and 50c in such a way as to elongate 50a and 50b as in FIG. 5A and, reversely, a borderline is set in a border between 50b and 50c in such a way as to elongate 50b as in FIG. 5B. In this manner, a borderline may be set in various ways. According to the present example embodiment, magnetic alloy films 50a, 50b, and 50c previously magnetized are caused to adhere to the exterior body 51. When magnetic alloy foil is formed into a winding shape in this manner, a length is increased, compared with when the entire flat surface is formed of a magnetic alloy film, and thereby acquired electromotive force can be increased. The electrode 55 and the electrode 57 each may be formed into a circular shape or a rectangular shape by using the same material as in a magnetic alloy film 50a being in contact with the electrode or may be formed by using a separate material.

Figure 6:
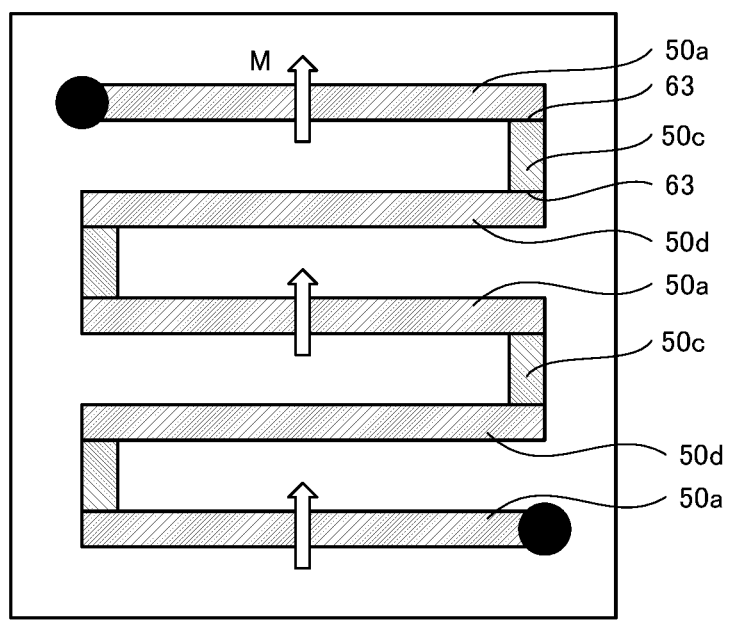
FIG. 6 is a diagram illustrating a planar shape of the magnetic alloy film according to the third example embodiment of the present invention.

In a battery of FIG. 6, only a magnetic alloy film 50a is magnetized and is connected to a non-magnetic alloy film 50d. A film 50c may be magnetized similarly to the examples in FIG. 5A and FIG. 5B or may be non-magnetic. In FIG. 6, while a borderline 63 among the magnetic alloy film 50a, the film 50c, and the non-magnetic alloy film 50d is set in such a way as to elongate 50a and 50d, the borderline 63 may be set, as in FIG. 5B, in such a way as to shorten 50a and 50d. It may be possible that a borderline is set in a border between 50a and 50c in such a way as to elongate 50a and 50d as in FIG. 5A and, reversely, a borderline is set in a border between 50d and 50c in such a way as to elongate 50d. In this manner, a borderline may be set in various ways.

While in FIG. 5A, FIG. 5B, and FIG. 6, magnetization is performed in a line-width direction, magnetization may be performed in a longitudinal direction. In this case, magnetization is performed for going and returning of a meandering shape pattern in opposite directions.

Figure 7:
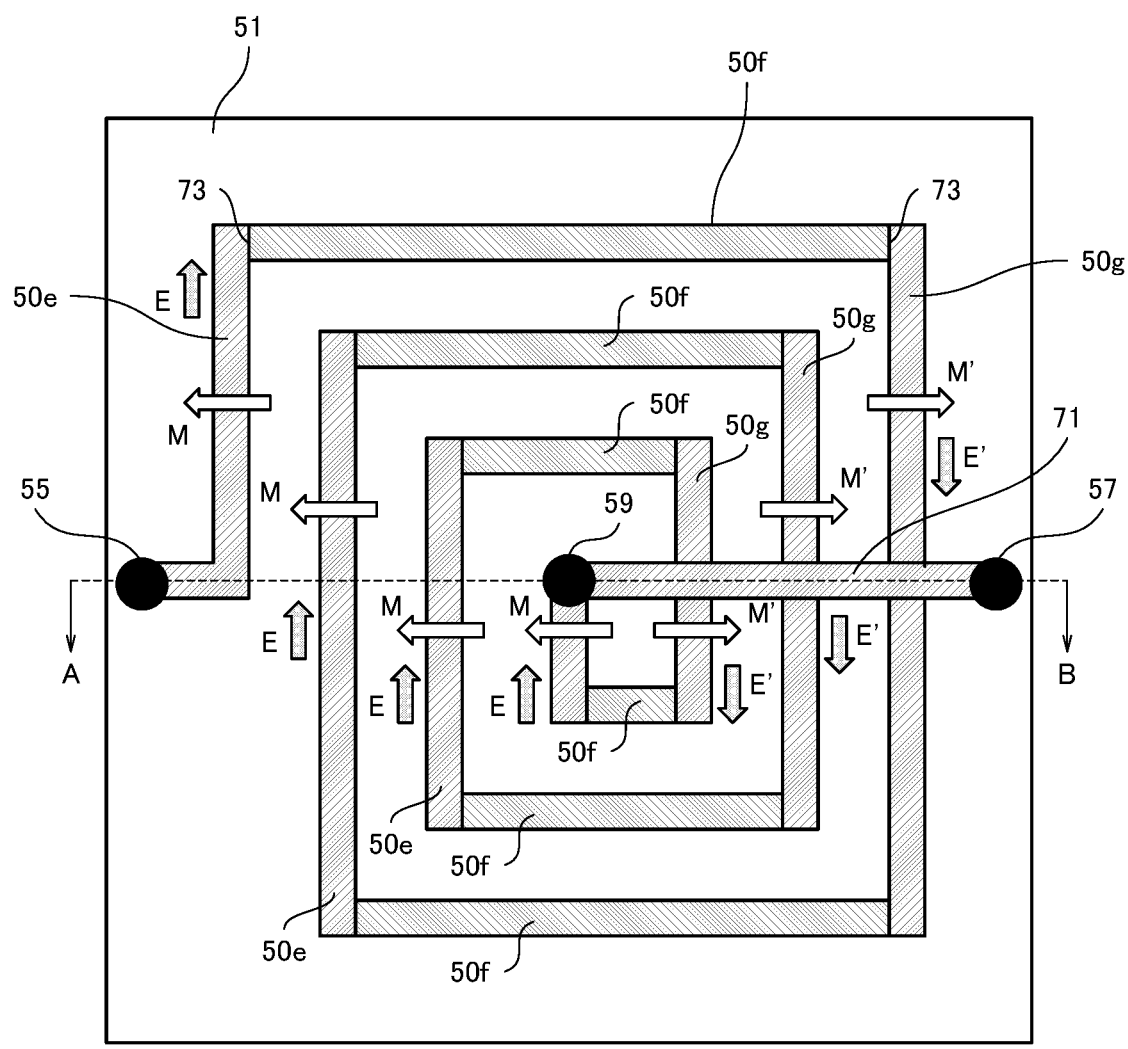
FIG. 7 is a diagram illustrating a planar shape of the magnetic alloy film according to the third example embodiment of the present invention.
Figure 8:
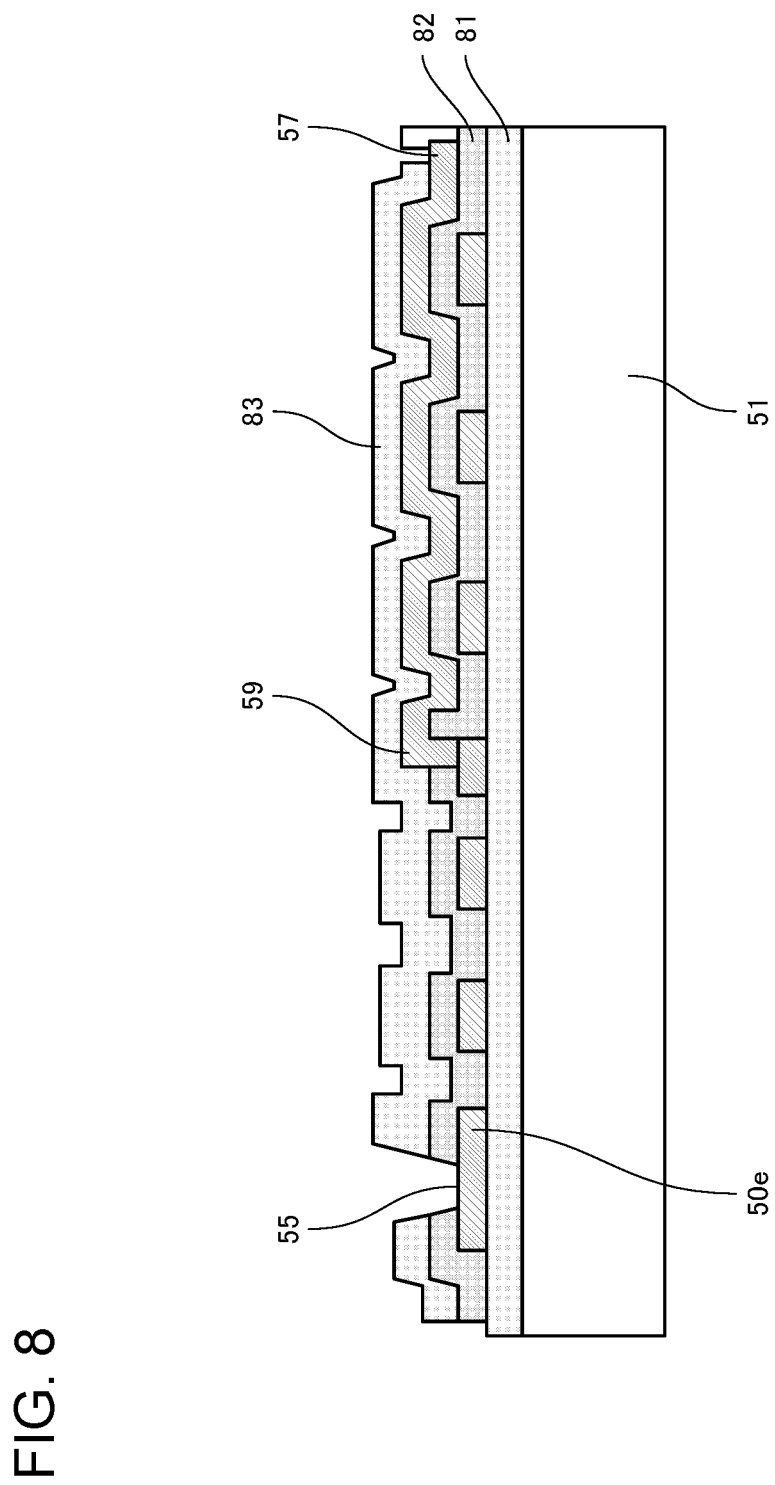

FIG. 7 illustrates an example in which a planar shape of a magnetic alloy film 50 between electrodes 55 and 57 is formed into a spiral shape. FIG. 8 is a schematic cross-sectional diagram between A and B in FIG. 7. Between an electrode 59 at the center of a spiral and an electrode 57 for extracting voltage to an outside, a resin layer 82 formed on a magnetic alloy film 50 is opened on the electrode 59, and wiring 71 connecting the electrodes 59 and 57 is formed on the resin layer 82, whereby connection is established. A direction of spontaneous magnetization is a line-width direction as illustrated in FIG. 7, and for a magnetic alloy film 50e close to the electrode 55, the direction is a direction (M) from the electrode 57 to the electrode 55 and for a magnetic alloy film 50g close to the electrode 57, the direction is reversely a direction (M') from the electrode 55 to the electrode 57. A film 50f connecting the magnetic alloy films 50e and 50g is formed of non-magnetic alloy. A magnetization direction of a magnetic alloy film other than these is achieved similarly to the magnetic alloy film 50e when being closer to the electrode 55 than the electrode 59 and is achieved similarly to 50g when being close to the electrode 57. As understood from FIG. 8, on an exterior body 51, a resin layer 81 is provided, thereon, a magnetic or non-magnetic alloy film is provided, thereon, a resin layer 82 is provided, and thereon, a resin layer 83 is further provided. The electrodes 55, 57, and 59 may be formed into a circular shape or a rectangular shape by using the same material as in the magnetic alloy film 50e being contact with the electrodes and the wiring 71 or may be formed of a separate material. While in FIG. 7, a borderline 73 among the magnetic alloy films 50e and 50g and the non-magnetic alloy film 50f is set in such a way as to elongate 50e and 50g, the borderline may be set in such a way as to shorten 50e and 50g. It may be possible that a borderline is set in a border between the magnetic alloy film 50e and the non-magnetic alloy film 50f in such a way as to elongate 50e and, reversely, a borderline is set in a border between the magnetic alloy film 50g and the non-magnetic alloy film 50f in such a way as to elongate 50f. In this manner, a borderline may be set in various ways.

Fourth Example Embodiment

Figure 9A:
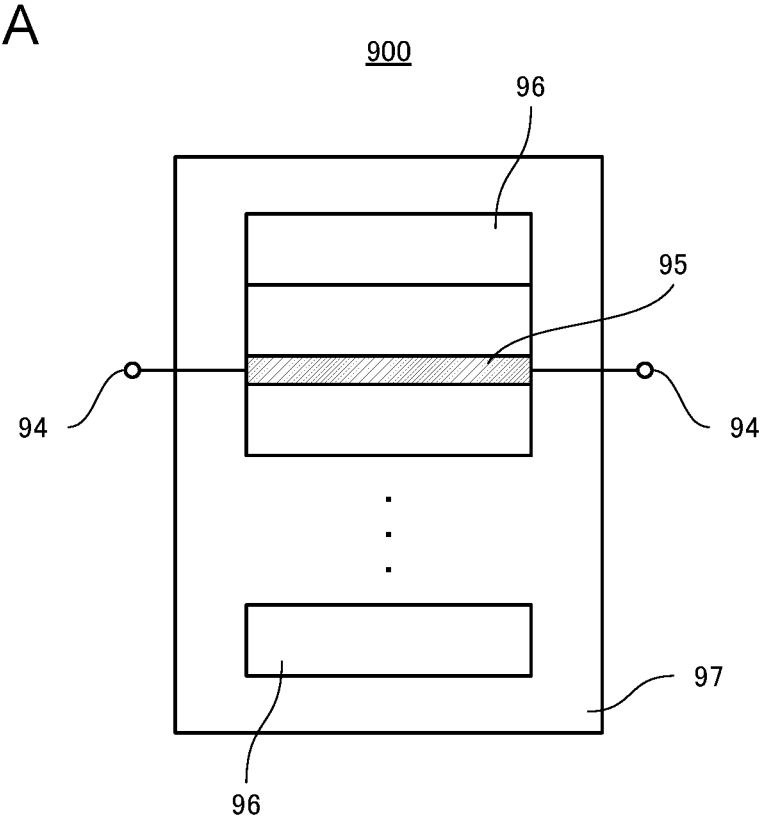
FIG. 9A is a diagram schematically illustrating a laminated battery including an abnormality detector according to a fourth example embodiment of the present invention.
Figure 9B:
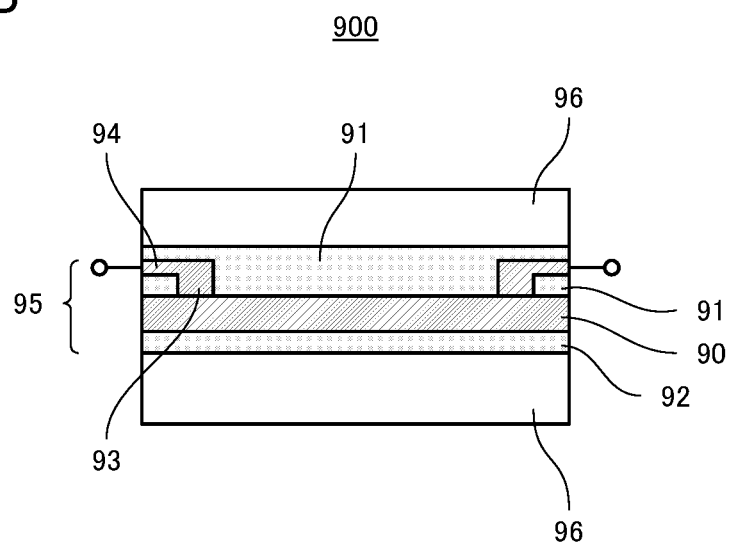
FIG. 9B is a diagram schematically illustrating the laminated battery including the abnormality detector according to the fourth example embodiment of the present invention.

According to the present example embodiment, an abnormality detector is provided in a module of a lithium-ion secondary battery. Commonly, a battery element of a secondary battery includes a positive electrode, a negative electrode, a separator, an electrolytic solution, and a lead terminal and is covered with an exterior body, and thereby a unit cell is formed. A plurality of unit cells are laminated (connected in series or in a serial/parallel manner) and a module is formed. As a result, during operation, it is difficult for a laminated central portion to become exoergic and the central portion is likely to become hot, and therefore in the central portion, abnormality tends to occur. According to the present example embodiment, a magnetic alloy film (and a resin layer) described according to the third example embodiment is caused to adhere onto a unit cell of a central portion (or a vicinity of the central portion) of a battery, and a resulting member is formed as an abnormality detector. FIG. 9A and FIG. 9B each are a diagram schematically illustrating a laminated battery 900 including the abnormality detector, and FIG. 9A is a schematic diagram of the entire laminated battery and FIG. 9B is a schematic cross-sectional diagram illustrating only an abnormality detector 95 (and both adjoining unit cells 96). The abnormality detector 95 is formed in such a way as to be inserted between a unit cell and a unit cell. The abnormality detector 95 includes, similarly to FIG. 4A and FIG. 4B, a magnetic alloy layer 90 and resin layers 91 and 92, and from an opening 93 of the resin layer 91, an electrode 94 is led out. The abnormality detector 95 is caused to adhere to a certain unit cell 96 and two electrodes 94 are led out. After unit cells are laminated and the laminated unit cells are accommodated in an exterior body 97, an electrolytic solution (not illustrated) is injected and an end of the exterior body 97 is sealed by excluding a charging/discharging electrode (not illustrated) portion of a battery and a portion from which an electrode 94 of an abnormality detector is lead out. The abnormality detector according to the present example embodiment has a thickness of several µm and is very thin, and therefore does not become an obstacle when unit cells are laminated. When a thermoelectric element is disposed between a unit cell and a unit cell, the two unit cells have substantially the same temperature during normal operation and the abnormality detector 95 does not detect a temperature gradient (temperature gradients are cancelled). Therefore, an output signal of the abnormality detector 95 is zero. However, when one unit cell generates abnormal heat, a temperature of the unit cell is higher than a unit cell normally operating, and the abnormality detector 95 detects a temperature gradient. Thereby, abnormality can be detected. Therefore, abnormality can be detected as long as upper and lower unit cells sandwiching the abnormality detector 95 do not generate abnormal heat at the same time. In a case where there is a possibility that upper and lower unit cells generate heat similarly, cancellation of temperature gradients can be prevented by sandwiching a heat-transfer layer having high thermal conductivity between upper and lower laminated cells (between an exterior material and an exterior material) and releasing heat flow in an in-plane direction of the heat transfer layer.

One abnormality detector is caused to adhere to each set of a plurality of unit cells including unit cells not only in a center vicinity but also in an end vicinity of a laminated cell, and thereby an electrode can be separately led out from an exterior body.

Figure 10:
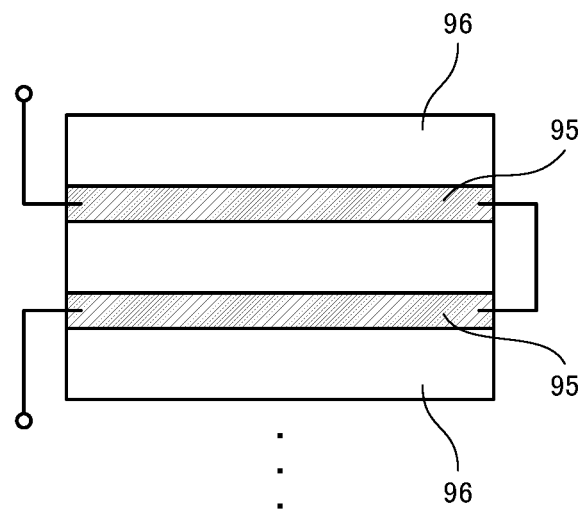
FIG. 10 is a diagram illustrating the third example embodiment of the present invention.

As illustrated in FIG. 10, it may be possible that a plurality of abnormality detectors 95 are connected in series and thereby a voltage able to be output to an outside is increased. A total value (accumulated voltage value) of electromotive force during normal operation is previously measured. When any unit cell is abnormal and generates electromotive force larger than normal, an accumulated voltage value becomes high, and thereby abnormality can be detected. Alternatively, a predetermined threshold voltage is set, and when the threshold voltage is reached or exceeded, abnormality may be determined. When a configuration is made in this manner, the number of electrodes led out from an exterior body can be reduced.

Figure 11:
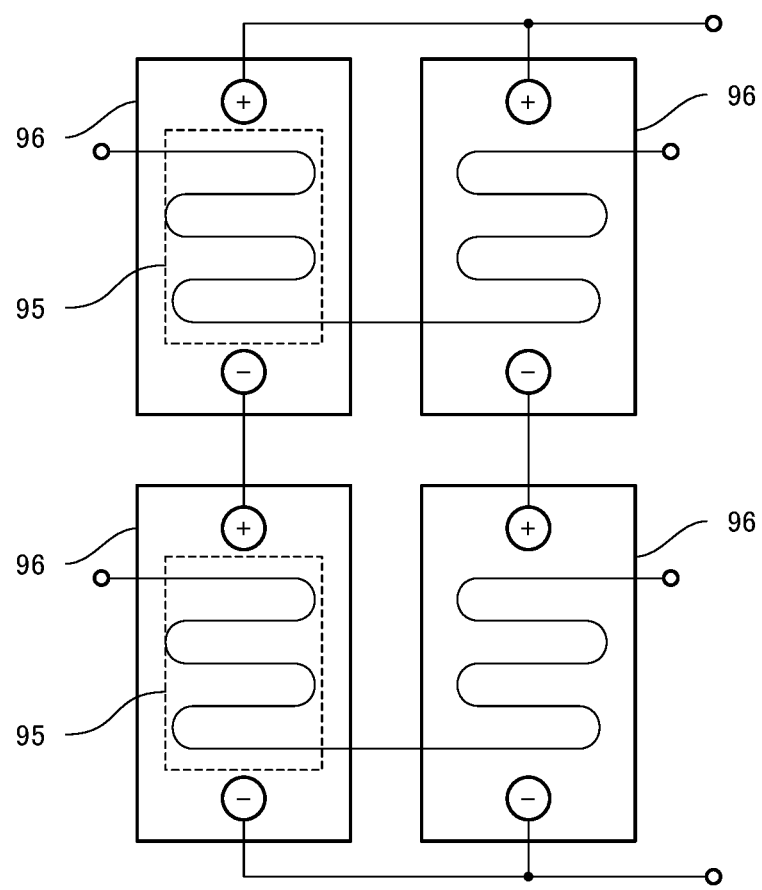
FIG. 11 is a diagram illustrating the fourth example embodiment of the present invention.

Unit cells may be connected in a serial/parallel manner. In FIG. 11, for example, two unit cells 96 each including an abnormality detector 95 are connected in series and the two unit cells are connected in parallel. When electrodes of the abnormality detectors 95 are connected between the two unit cells 96, it is detected that abnormality occurs in one cell or both cells connected in parallel. While not illustrated, it may be possible that the abnormality detector 95 is not connected to another abnormality detector and electrodes can be individually led out to an outside. While the number of electrodes increases, a unit cell in which abnormality occurs can be identified more clearly. As a physical mounting method, surfaces of upper-left and upper-right unit cells 96 (and lower-left and lower-right unit cells 96) in FIG. 11 are overlapped with each other in a face-to-face folding manner, and thereby mounting as a laminated cell can be achieved.

Fifth Example Embodiment

Figure 12:
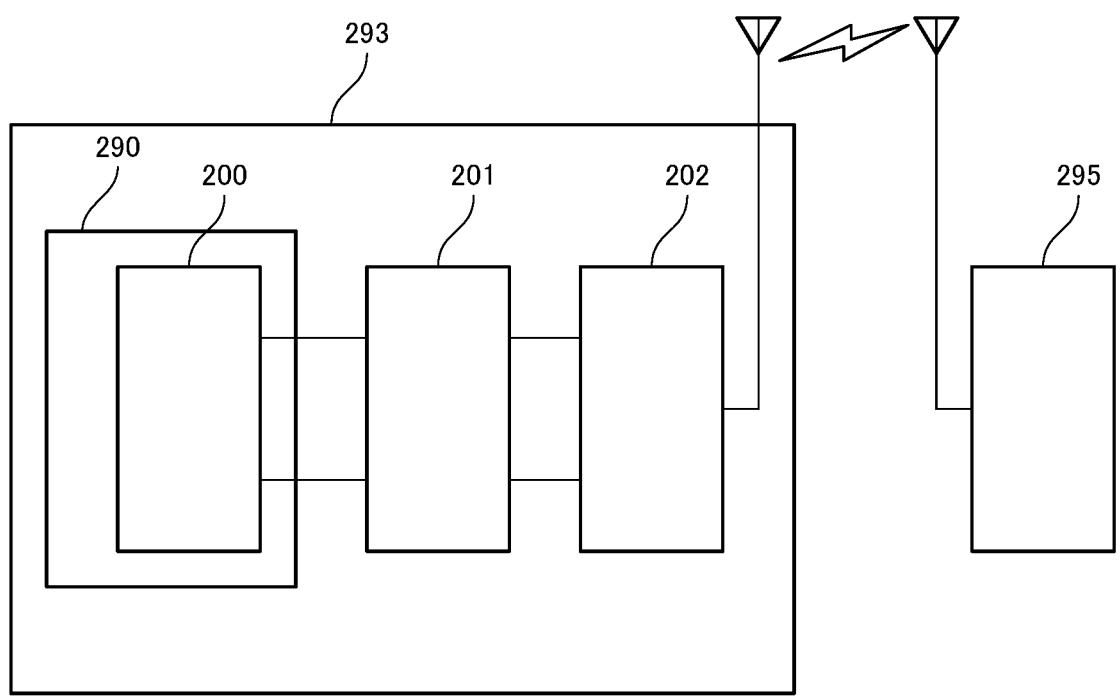
FIG. 12 is a diagram illustrating a fifth example embodiment of the present invention.

The present example embodiment is an abnormality monitoring system including a radio device including a function of reporting abnormality of a battery to an outside. As illustrated in FIG. 12, the abnormality monitoring system includes a radio terminal 293 including a battery 290, and an external reception device 295 (an external terminal, a server, and the like). On the radio terminal 293, the battery 290 including an abnormality detector 200, a detection circuit 201, a radio transmission circuit 202, and an antenna 203 are mounted. When the detection circuit 201 determines that abnormality occurs, an abnormal signal is transmitted to an outside. On the radio terminal 293, a circuit for executing an original operation of a radio terminal is also mounted, but the circuit is not illustrated in FIG. 12. As the battery 290, either of a battery in which an exterior body itself doubles as an abnormality detector and a battery in which an abnormality detector is caused to adhere to an exterior body of a cell described according to the first to fourth example embodiments is usable. An output of the abnormality detector 200 is input to the detection circuit 201. The detection circuit 201 is connected to the radio transmission circuit 202 and an output of the radio transmission circuit 202 is connected to the antenna 203, and thereby an abnormal signal generated by the detection circuit 201 is transmitted to an external reception device 295. The reception device 295 receives an abnormal signal and issues a warning such as displaying an alarm on a screen (not illustrated) of the radio terminal 293, or causing a speaker (not illustrated) of the radio terminal 293 to generate an alarm sound.

The detection circuit 201, the radio transmission circuit 202, and the antenna 203 may be operated through connection to a power supply that is not illustrated and can be operated, when power thermoelectrically generated by the abnormality detector 200 is sufficiently large, by using the power without an external power supply. As the antenna 203, an antenna used for common communication by the radio terminal 293 can be appropriated.

It may be possible that the radio terminal 293 merely transmits, to the reception device 295, a signal detected according to electromotive force without determining whether to be abnormal, and determining whether to be abnormal is performed by the reception device 295.

Sixth Example Embodiment

Figure 13:
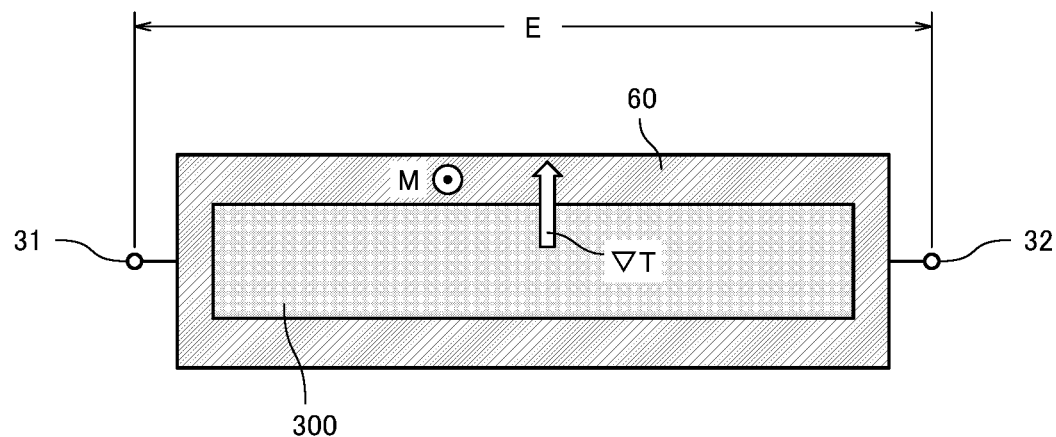
FIG. 13 is a cross-sectional diagram illustrating a sixth example embodiment of the present invention.

FIG. 13 is a diagram illustrating an exterior body 60 according to a sixth example embodiment of the present invention. The exterior body 60 is an exterior body of an electronic device 300 generating heat during operation and includes, as at least a part of the exterior body, a magnetic body that has spontaneous magnetization M and generates electromotive force by exhibiting an abnormal Nernst effect through heat generation of the electronic device 300 and electrodes 31 and 32 for extracting power to the magnetic body.

When abnormal heat is generated by any cause in the electronic device 300, a temperature gradient $\nabla T$ is generated in a thickness direction of the exterior body 60. Commonly, an electronic device 300 side of the exterior body 60 has high temperature and an outside thereof has low temperature. As a result, the exterior body 60 exhibits an abnormal Nernst effect and electromotive force E is generated between the electrode 31 and the electrode 32 provided at both ends of the exterior body 60. By doing so, an output according to electromotive force E can be extracted between the electrodes 31 and 32.

Seventh Example Embodiment

Figure 14:
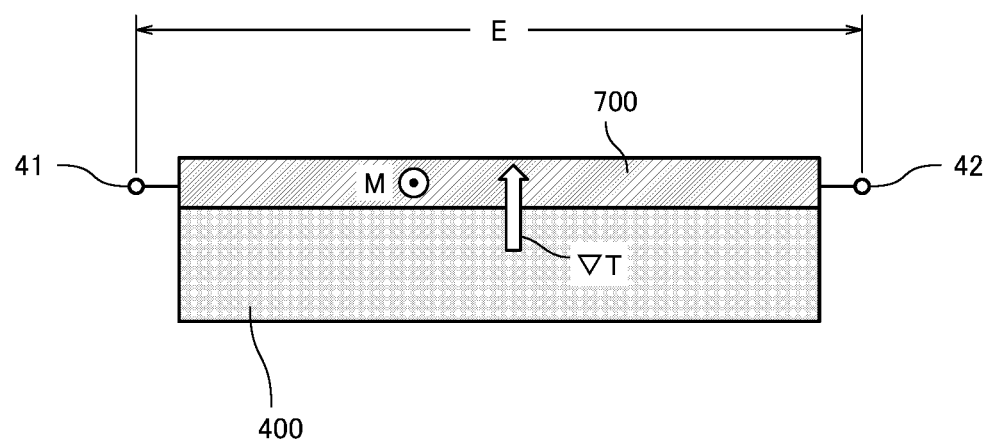
FIG. 14 is a cross-sectional diagram illustrating a seventh example embodiment of the present invention.

FIG. 14 is a diagram illustrating an abnormality detector according to a seventh example embodiment of the present invention. A magnetic body film 700 that has spontaneous magnetization and generates electromotive force E by exhibiting an abnormal Nernst effect through heat generation of a secondary battery is provided on a battery element 400 constituting the secondary battery, and electrodes 41 and 42 that extract an output based on the electromotive force E are provided in the magnetic body film 700.

When abnormal heat is generated by any cause in the battery element 400, a temperature gradient $\nabla T$ is generated in a thickness direction of the magnetic body film 700. Commonly, a battery element 400 side of the magnetic body film 700 has high temperature and an outside thereof has low temperature. As a result, the magnetic body film 700 exhibits an abnormal Nernst effect and electromotive force E is generated between the electrode 41 and the electrode 42 provided at both ends of the magnetic body film 700. By doing so, an output according to electromotive force E can be extracted between the electrodes 31 and 32.

Other Example Embodiments

According to the above-described example embodiments, as a magnetic body, magnetic alloy was used, but instead, based on a spin Seebeck effect in a laminated body formed of a metal film and a magnetic insulator film, similar heat flow detection is made possible. A bilayer film in which, for example, platinum being metal and yttrium-iron-garnet (YIG) being a magnetic insulator are laminated can be used instead of the magnetic alloy film. While according to the above-described example embodiments, all batteries are a laminated type, a winding type is also applicable. The present invention is applicable to not only a battery but also another power storage device such as a capacitor and the like and in addition, is applicable not only to a power storage device but also to an electronic device that may generate abnormal heat.

The whole or part of the example embodiments disclosed above can be described as, but not limited to, the following supplementary notes.

(Supplementary Note 1)

An exterior body of an electronic device that generates heat during operation, the exterior body including: a magnetic body, as at least a part of the exterior body, that has spontaneous magnetization and generates electromotive force by exhibiting an abnormal Nernst effect through heat generation of the electronic device; and an electrode for extracting power, being provided on the magnetic body.

(Supplementary Note 2)

The exterior body according to supplementary note 1, the exterior body detecting abnormal heat generation of the electronic device.

(Supplementary Note 3)

The exterior body according to supplementary note 1 or 2, the exterior body entirely including the magnetic body.

(Supplementary note 4)

The exterior body according to supplementary note 1 or 2, the exterior body including the magnetic body and a non-magnetic body.

(Supplementary Note 5)

The exterior body according to any one of supplementary notes 1 to 4, wherein the magnetic body is formed of magnetic alloy.

(Supplementary Note 6)

The exterior body according to any one of supplementary notes 1 to 5, wherein a predetermined threshold is set for the power, and it is determined, when the power is equal to or more than the predetermined threshold, that abnormal heat is generated.

(Supplementary Note 7)

The exterior body according to supplementary note 4, wherein a member acquired by forming a pattern of the magnetic body on a non-magnetic body is used as the exterior body.

(Supplementary note 8)

The exterior body according to supplementary note 7, wherein the pattern of the magnetic body is a winding shape.

(Supplementary Note 9)

The exterior body according to supplementary note 6 or 7, wherein a direction of spontaneous magnetization of the magnetic body is a line width direction of the pattern of the magnetic body and in going and returning of winding of the pattern, directions of spontaneous magnetization are opposite.

(Supplementary Note 10)

An abnormality detector of a secondary battery, the abnormality detector including: a magnetic body film that has spontaneous magnetization and generates electromotive force by exhibiting an abnormal Nernst effect through abnormal heat generation of the secondary battery, being provided on a cell constituting the secondary battery; and an electrode for extracting power, being provided on the magnetic body film.

(Supplementary note 11)

The abnormality detector according to supplementary note 10, the abnormality detector being inserted between a unit cell and a unit cell constituting the secondary battery.

(Supplementary Note 12)

The abnormality detector according to supplementary note 10 or 11, wherein a member acquired by forming a pattern of the magnetic body film on the cell is used.

(Supplementary Note 13)

The abnormality detector according to supplementary note 12, wherein the pattern of the magnetic body film is a winding shape.

(Supplementary Note 14)

The abnormality detector according to supplementary note 13, wherein a direction of spontaneous magnetization of the magnetic body film is a line width direction of the pattern of the magnetic body film, and in going and returning of winding of the pattern, directions of spontaneous magnetization are opposite.

(Supplementary Note 15)

An abnormality detection system including: a detection circuit that detects an output from the electrode of the exterior body according to any one of supplementary notes 1 to 9; a radio transmission circuit being connected to an output of the detection circuit; and an antenna being connected to an output of the radio transmission circuit.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-206482, filed on Nov. 1, 2018, the disclosure of which is incorporated herein in its entirety by reference.

REFERENCE SIGNS LIST 1, 1a, 1b, 701 Magnetic body
2, 400 Battery element
3a, 3b, 4a, 4b, 31, 32, 41, 42, 94 Electrode
20 Magnetic alloy film
21, 22, 91, 92 Resin layer
23, 93 Opening
26 Insulation layer
24, 501A, 501B Exterior body
50, 50a, 50b Magnetic alloy film
50d, 50f Non-magnetic alloy film
51, 60 Exterior body
55, 57, 59 Electrode
53, 63, 73 Borderline
71 Wiring
90 Magnetic alloy layer
95, 200 Abnormality detector
96 Unit cell
201 Detection circuit
202 Radio transmission circuit
203 Antenna
290 Battery
293 Radio terminal
295 Reception device
300 Electronic device
601 Laminate film
900 Laminated battery

What is claimed is:

1. An exterior body of an electronic device that generates heat during operation, the exterior body comprising: a magnetic body, as at least a part of the exterior body, that has spontaneous magnetization and generates electromotive force by exhibiting an abnormal Nernst effect through heat generation of the electronic device; and an electrode for extracting power, being provided on the magnetic body.

2. The exterior body according to claim 1, the exterior body detecting abnormal heat generation of the electronic device.

3. The exterior body according to claim 1, the exterior body being formed by laminating a metal layer and an insulation layer, wherein the metal layer entirely includes the magnetic body.

4. The exterior body according to claim 1, the exterior body comprising the magnetic body and a non-magnetic body.

5. The exterior body according to claim 4, wherein a member acquired by forming a pattern of the magnetic body on a non-magnetic body is used as the exterior body.

6. The exterior body according to claim 5, wherein the pattern of the magnetic body is a winding shape.

7. The exterior body according to claim 1, wherein the magnetic body is formed of magnetic alloy.

8. The exterior body according to claim 1, wherein a predetermined threshold is set for the power, and it is determined, when the power is equal to or more than the predetermined threshold, that abnormal heat is generated.

9. The exterior body according to claim 8, wherein a direction of spontaneous magnetization of the magnetic body is a line width direction of the pattern of the magnetic body, and in going and returning of winding of the pattern, directions of spontaneous magnetization are opposite.

10. An abnormality detection system comprising: a detection circuit that detects an output from the electrode of the exterior body according to claim 1; a radio transmission circuit being connected to an output of the detection circuit; and an antenna being connected to an output of the radio transmission circuit.

* * * * *